(12) United States Patent
Itabashi et al.

(10) Patent No.: US 9,825,602 B2
(45) Date of Patent: Nov. 21, 2017

(54) AMPLIFIER

(71) Applicant: SUMITOMO ELECTRIC INDUSTRIES, LTD., Osaka (JP)

(72) Inventors: Naoki Itabashi, Kawasaki (JP); Keiji Tanaka, Chigasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/299,288

(22) Filed: Oct. 20, 2016

(65) Prior Publication Data

US 2017/0117860 A1    Apr. 27, 2017

(30) Foreign Application Priority Data

Oct. 23, 2015   (JP) .................................. 2015-208561

(51) Int. Cl.
*H03F 3/55*        (2006.01)
*H03F 1/48*        (2006.01)
(Continued)

(52) U.S. Cl.
CPC ................. *H03F 3/55* (2013.01); *H03F 1/48* (2013.01); *H03F 1/565* (2013.01); *H03F 3/4508* (2013.01);
(Continued)

(58) Field of Classification Search
CPC ...................................................... H03F 3/55
(Continued)

(56) References Cited

U.S. PATENT DOCUMENTS 7,227,878 B1 * 6/2007 Choi ..................... G02F 1/0121
                                                           372/26
2005/0057304 A1 * 3/2005 Gilbert ..................... H03F 1/26
                                                           330/254
(Continued)

FOREIGN PATENT DOCUMENTS

JP          H11-183858          7/1999
JP          2003-304131         10/2003
(Continued)

OTHER PUBLICATIONS

Y. Baeyens, et al., "High Gain-Bandwidth Differential Distributed InP D-HBT Driver Amplifiers With Large (11.3 Vpp) Output Swing at 40 Gb/s", IEEE Journal of Solid-State Circuits, vol. 39, No. 10, pp. 1697-1705, Oct. 2004.

*Primary Examiner* — Patricia T Nguyen
(74) *Attorney, Agent, or Firm* — Smith, Gambrell & Russell, LLP

(57) ABSTRACT

An amplifier including a pre-amplifier, an impedance converter, and a traveling wave amplifier (TWA) is disclosed. The pre-amplifier receives a differential input signal and has a pair of first output nodes that output a first differential signal by amplifying the differential input signal. Each first output node has first output impedance. The impedance converter includes a pair of first input nodes that receive the first differential signal and a pair of second output nodes that output a second differential signal. Each first input node has first input impedance greater than the first output impedance. The impedance converter converts the first differential signal into the second differential signal. Each second output node has second output impedance smaller than the first output impedance. The TWA includes a pair of transmission lines connected to the pair of the second output nodes. Each (Continued)

transmission line has characteristic impedance matching with the second output impedance.

7 Claims, 4 Drawing Sheets

(51) Int. Cl.
  *H03F 1/56* (2006.01)
  *H03F 3/45* (2006.01)
  *H03F 3/60* (2006.01)
(52) U.S. Cl.
  CPC ......... *H03F 3/45475* (2013.01); *H03F 3/602* (2013.01); *H03F 3/605* (2013.01); *H03F 2200/387* (2013.01); *H03F 2200/451* (2013.01)
(58) Field of Classification Search
  USPC .................................................. 330/286, 302
  See application file for complete search history.

(56) References Cited

U.S. PATENT DOCUMENTS

| | | | | |
|---|---|---|---|---|
| 2009/0243717 | A1* | 10/2009 | Bonthron | H03F 3/45089 330/10 |
| 2014/0028400 | A1* | 1/2014 | Suzuki | H03F 3/45085 330/291 |
| 2015/0070097 | A1* | 3/2015 | Bauer | H03F 1/0227 330/296 |
| 2016/0380699 | A1* | 12/2016 | Tatsumi | H04B 10/516 330/286 |

FOREIGN PATENT DOCUMENTS

| | | |
|---|---|---|
| JP | 2012-216920 | 11/2012 |
| JP | 2013-239952 | 11/2013 |

\* cited by examiner

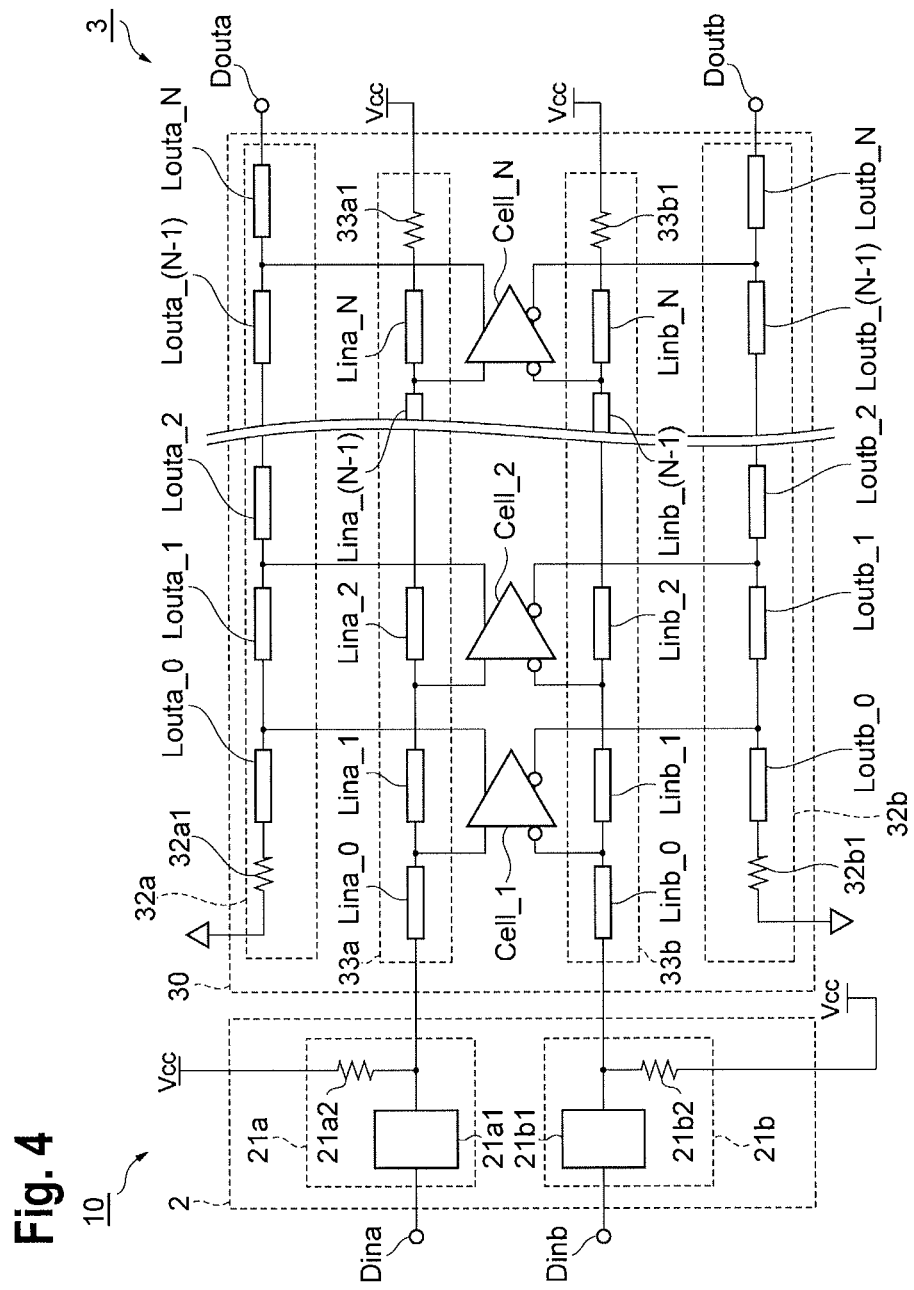

AMPLIFIER

BACKGROUND OF THE INVENTION

1. Field of the Invention

The present invention relates to an amplifier, and more specifically to an amplifier used in a driving circuit for driving a semiconductor laser or an optical modulator.

2. Description of the Related Art

Traveling Wave Amplifier (TWA) has been used as a wideband amplifier suitable for the driving circuit. A basic circuit structure of TWA includes at least an input terminal, an input-side transmission line, a plurality of sub-amplifiers, an output-side transmission line, and an output terminal. The input terminal receives an input signal from an outside of TWA. One end of the input-side transmission line is connected to the input terminal and transmits the input signal to the sub-amplifiers. The sub-amplifiers are arranged in a line along the input-side transmission line and the output-side transmission line. Each sub-amplifier has an input node and an output node. The input nodes of the sub-amplifiers receive the input signal through the input transmission line. Each sub-amplifier amplifies the input signal and outputs an amplified signal from the output node thereof to the output-side transmission line. The output-side transmission line transmits the amplified signals to the output terminal. The amplified signals are superimposed with each other during the transmission to generate an output signal from the output terminal.

Each sub-amplifier receives the input signal from the input terminal to the input node thereof with an individual delay time, which is different from the delay time of other sub-amplifiers. Each amplified signal transmits from the output node thereof to the output terminal with an individual delay time, which is different from the delay time of other sub-amplifiers. However, sum of the delay time for the input signal and the delay time for the output signal is balanced for all the sub-amplifiers.

The sub-amplifiers may be the same single-ended amplifier to each other or the same differential amplifier to each other except a combination of them. The single-ended amplifier has an input node and an output node as described above. The differential amplifier, however, has at least a pair of input terminals and a pair of output terminals. For example, the differential amplifier receives a positive-phase input signal in one of the input nodes and a negative-phase input signal in the other of the input nodes. The positive-phase input signal and the negative-phase input signal have opposite phases to each other. In addition, the differential amplifier outputs a positive-phase output signal from one of the output nodes thereof and a negative-phase output signal from the other of the output nodes thereof. The positive-phase output signal and the negative-phase output signal have opposite phases to each other. Accordingly, in a case that differential amplifiers are used for the sub-amplifiers, the circuit configuration of the TWA needs at least a pair of input terminals, a pair of input-side transmission lines, a pair of output-side transmission lines, and a pair of output terminals except the sub-amplifiers.

As aforementioned, the input-side transmission line transmits the input signal and the output-side transmission line transmits the amplified signals output from the sub-amplifiers, respectively. In general, electrical characteristics of a transmission line can be characterized by characteristic impedance. Characteristic impedance of the input-side transmission line is often set to match with output impedance of an upstream circuit that provides the input signal to the TWA. Characteristics impedance of the output-side transmission line is often set to match with input impedance of a downstream circuit that is driven by the output signal of the TWA. The characteristic impedance depends on distributed inductor and distributed capacitor of the transmission line. The transmission lines cause respective individual delay times for a transmitted signal. Wideband amplifiers are often needed to maintain fine matching between the output impedance thereof and characteristic impedance of the transmission line up to a high frequency.

SUMMARY OF THE INVENTION

According to an aspect of the present invention, there is provided an amplifier that receive a differential input signal and generate a differential output signal in accordance with the differential input signal. Each of the differential input signal and the differential output signal has a positive-phase component and a negative-phase component. The positive-phase components have phases opposite to phases that the negative-phase components have. The amplifier includes a preamplifier, an impedance converter, and a traveling wave amplifier (TWA). The pre-amplifier is configured to receive the differential input signal and generate a first differential signal by amplifying the differential input signal. The first differential signal has a positive-phase component and a negative-phase component. The pre-amplifier includes a pair of first output nodes that output the positive-phase component and the negative-phase component of the first differential signal, respectively. The pre-amplifier has first output impedance viewed from the output nodes. The impedance converter includes a pair of first input nodes and a pair of second output nodes. The pair of the first input nodes is configured to receive the positive-phase component and the negative-phase component of the first differential signal, respectively. The impedance converter has first input impedance viewed from the first input nodes. The first input impedance is greater than the first output impedance of the pre-amplifier. The impedance converter is configured to convert the first differential signal into a second differential signal, which has a positive-phase component and a negative-phase component. The pair of the second output nodes is configured to output the positive-phase component and the negative-phase component of the second differential signal, respectively. The impedance converter has second output impedance viewed from the second output nodes. The second output impedance is smaller than the first output impedance of the pre-amplifier. The TWA is configured to receive the second differential signal and generate the differential output signal in accordance with the second differential signal.

BRIEF DESCRIPTION OF THE DRAWINGS

FIG. 4 is a circuit diagram of a comparative example.

DETAILED DESCRIPTION OF THE INVENTION

Figure 1:
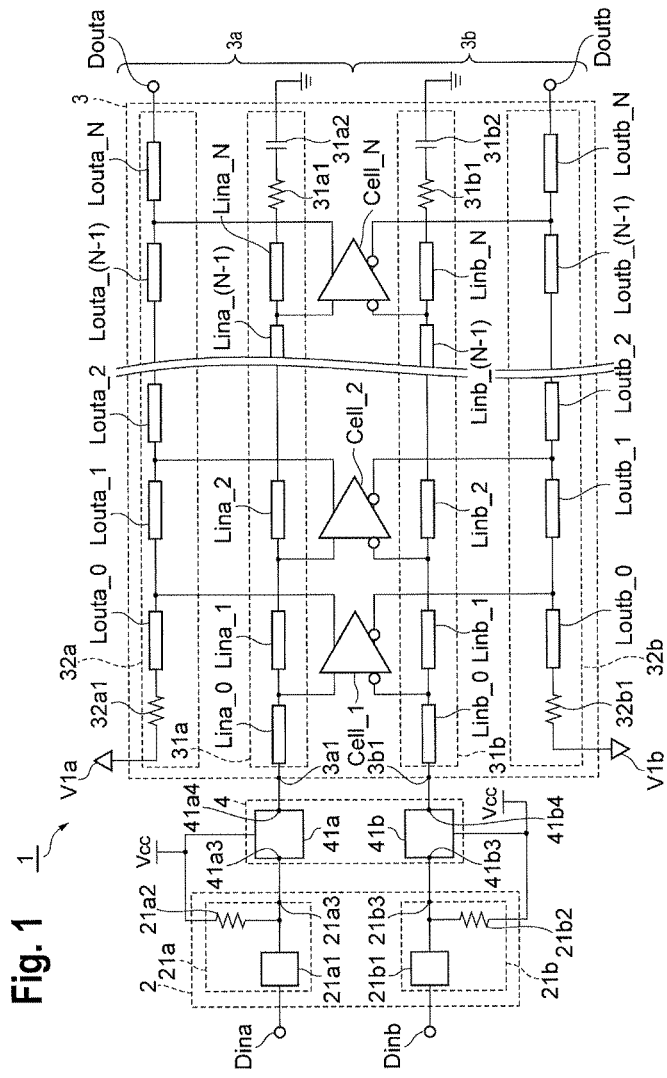
FIG. 1 is a circuit diagram of an amplifier according to an embodiment of the present invention.

Hereinafter, an amplifier according to an embodiment of the present invention will be described in detail with reference to the attached drawings. Note that the same components in the description of the drawings are indicated by the same reference numerals, and overlapping descriptions are omitted.

FIG. 1 is a circuit diagram of an amplifier according to an embodiment of the present invention. The amplifier 1 receives a differential input signal from an external apparatus (first apparatus) and generates a differential output signal in accordance with the differential input signal. The amplifier 1 includes a pair of input terminals Dina, Dinb, a pre-amplifier 2 (pre-buffer), a Traveling Wave Amplifier 3 (TWA), an impedance converter 4, and a pair of output terminals Douta, Doutb. The pre-amplifier 2, the impedance converter 4, and the TWA 3 are connected in cascade in this order, so as to transmit and amplify the differential input signal. The impedance converter 4 is arranged between the pre-amplifier 2 and the TWA 3. The pre-amplifier 2 has at least output impedance viewed from the output nodes thereof (first output impedance). The impedance converter 4 has input impedance viewed from the input nodes (first input impedance) and output impedance viewed from the output nodes (second output impedance). The input impedance (first input impedance) is greater than the output impedance (first output impedance) and is also set to be greater than output impedance of the pre-amplifier 2.

The pair of input terminals Dina, Dinb receives a differential signal (differential input signal) from an external apparatus (first apparatus). The pair of output terminals Douta, Doutb outputs an amplified differential signal amplified by the amplifier 1 to an external apparatus (second apparatus) like Transmitter Optical Sub-Assembly (TOSA), optical modulator, and so on.

The input terminal Dina receives a positive-phase component of the differential input signal and the input terminal Dinb receives a negative-phase component of the differential input signal. The differential input signal includes the positive-phase component and the negative-phase component. The positive-phase component and the negative-phase component have opposite phases to each other. Namely, the positive-phase component has a phase different by 180° from the phase of the negative-phase component. The positive-phase component and the negative-phase component are complementary signals to each other. Each of the positive-phase component and the negative-phase component is an electrical signal like a voltage signal, but usually is not handled alone except cases of driving some optical devices. In general, the differential input signal corresponds to a difference in voltage level between the positive-phase component and the negative-phase component.

The output terminal Douta outputs a positive-phase component of the differential output signal generated by the TWA 1 to an external apparatus (second apparatus). The output terminal Doutb outputs a negative-phase component of the differential output signal generated by the TWA 3 to the external apparatus (second apparatus). The positive-phase component and the negative-phase component of the differential output signal have opposite phases to each other. Namely, the positive-phase component of the differential output signal has a phase different by 180° from a phase that the negative-phase component of the differential output signal has. The positive-phase component and the negative-phase component of the differential output signal are complementary signals to each other. Basically, a difference in voltage level between the positive-phase component and the negative-phase component is handled as the differential output signal. However, for example, only the output terminal Douta may be connected to the external apparatus (second apparatus), in a case that the external apparatus (second apparatus) is a semiconductor laser or an optical modulator, which need only single signal for being driven. In such a case, the output terminal Doutb may be connected to a termination resistor. In a case that only one of the positive-phase component and the negative-phase component is used, the one has amplitude equal to half of amplitude that the differential output signal has.

The pre-amplifier 2 receives the differential input signal through the input terminals Dina, Dinb and amplifies the differential input signal. The amplified differential input signal is output as a differential signal (first differential signal) with some output impedance (first output impedance). Specifically, the pre-amplifier 2 receives the positive-phase component of the differential input signal through the input terminal Dina and generates an amplified positive-phase component in accordance with the received positive-phase component. The pre-amplifier 2 also receives the negative-phase component of the differential input signal through the input terminal Dinb and generates an amplified negative-phase component in accordance with the received negative-phase component.

The pre-amplifier 2 has a pair of output nodes 21a3, 21b3 (first output nodes), which outputs the first differential signal. The first differential signal output from the output nodes 21a3, 21b3 includes a positive-phase component and a negative-phase component thereof. The positive-phase component, which is output from the output node 21a3 (one of the first output nodes), and the negative-phase component, which is output from the output node 21b3 (another of the first output nodes), are complementary signals that have opposite phases to each other.

The pre-amplifier 2 includes a pair of sub-preamplifiers 21a, 21b. The sub-preamplifiers 21a, 21b have the same circuit structure or the same circuit arrangement. The sub-preamplifier 21a includes an input node, an amplifying circuit 21a1, a resistive element 21a2 (first resistive element), and an output node 21a3. The resistive element 21a2 is connected between an external power supply Vcc and the output node 21a3. The sub-preamplifier 21b includes an input node, an amplifying circuit 21b1, a resistive element 21b2 (second resistive element), and an output node 21b3. The resistive element 21b2 is connected between the power supply Vcc and the output node 21b3. The sub-preamplifiers 21a, 21b may be separated single-ended amplifiers, which operate independently each other.

The pre-amplifier 2 has input impedance, which corresponds to input impedance of the amplifier 1. For example, the input impedance of the sub-preamplifier 21a is set to match with output impedance of the external apparatus (first apparatus) connected to the input terminal Dina. Alternatively, the input impedance of the sub-preamplifier 21a is set to match with characteristic impedance of a transmission line that connects the external apparatus (first apparatus) to the input terminal Dina. Likewise, the input impedance of the sub-preamplifier 21b is set to match with output impedance of the external apparatus (first apparatus) connected to the input terminal Dinb. Alternatively, the input impedance of the sub-preamplifier 21b is set to match with characteristic impedance of a transmission line that connects the external apparatus (first apparatus) with the input terminal Dinb. The input impedance of the sub-preamplifier 21a and the input impedance of the sub-preamplifier 21b are set to be the same resistance to each other, for example, 50Ω.

In a case that input impedance of the impedance converter 4 is set to be sufficiently greater than the resistance of the resistive element 21a2, output impedance (first output impedance) of the sub-preamplifier 21a approaches to and becomes substantially equal to resistance of the resistive element 21a2. Also, in a case that input impedance of the impedance converter 4 is set to be sufficiently greater than the resistance of the resistive element 21b2, output impedance (first output impedance) of the sub-preamplifier 21b approaches to and becomes substantially equal to resistance of the resistive element 21b2. Accordingly, the impedance (resistance) of the resistive element 21a2 is smaller than the input impedance (first input impedance) of the input terminal 41a3 and also greater than output impedance (second output impedance) of the output node 41a4 (one of the second output nodes) of the impedance converter 4. The impedance (resistance) of the resistive element 21b2 is smaller than the input impedance of the input terminal 41b3 and also greater than output impedance of the output node 41b4 (another of the second output nodes) of the impedance converter 4. The sub-converters 41a, 41b may be separated single-ended converter, which operate independently each other.

Resistance of the resistive element 21a2 and resistance of the resistive element 21b2 may be set to be the same resistance RL to each other, for example, about 50Ω. In general, as a positive-phase component and a negative-phase component of a differential signal are complementary signals to each other, it is preferable that a circuit structure to amplify them maintains balance in amplitude and phase thereof. In the sub-amplifier 21a, a voltage drop through the resistive element 21a2 caused by a current that the amplifying circuit 21a1 provides to the resistive element 21a2 corresponds to amplitude of an output signal of the sub-amplifier 21a. Therefore, change in resistance of the resistive element 21a2 causes change in amplitude of the output signal of the sub-amplifier 21a. Accordingly, in a case that a driving current provided by the amplifying circuit 21a1 to the resistive element 21a2 is saturated, voltage gain of the sub-preamplifier 21a is proportional to the resistance RL of the resistive element 21a2. Namely, increase in the resistance of the resistive element 21a2 causes increase in voltage gain of the sub-amplifier 21a. Reversely, decrease in the resistance of the resistive element 21a2 causes decrease in voltage gain of the sub-amplifier 21a. Likewise, in the sub-amplifier 21b, in a case that a driving current provided by the amplifying circuit 21b1 to the resistive element 21b2 is saturated, voltage gain of the sub-preamplifier 21b is proportional to the resistance RL of the resistive element 21b2. Therefore, the voltage gain of the sub-preamplifier 21a becomes substantially equal to the voltage gain of the sub-amplifier 21b.

The input node of the amplifying circuit 21a1 is coupled with the input terminal Dina. The input node of the amplifying circuit 21a1 receives the positive-phase component of the differential input signal output by the external apparatus (first apparatus) through the input terminal Dina. The output node of the amplifying circuit 21a1 corresponds to the output node 21a3 (one of the first output nodes) of the sub-amplifier 21a. In the sub-amplifier 21a, an output node of the amplifying circuit 21a1 is connected to the power supply Vcc through the resistive element 21a2. For example, voltage of the power supply Vcc is about 4 V.

The input node of the amplifying circuit 21b1 is coupled with the input terminal Dinb. The input node of the amplifying circuit 21b1 receives the negative-phase component of the differential input signal output by the external apparatus (first apparatus) through the input terminal Dinb. The output node of the amplifying circuit 21b1 corresponds to the output node 21b3 (another of the first output nodes) of the sub-amplifier 21b. In the sub-amplifier 21b, an output node of the amplifying circuit 21b1 is connected to the power supply Vcc through the resistive element 21b2.

The impedance converter 4 includes a pair of sub-converters 41a, 41b. The sub-converter 41a includes an input node 41a3 (one of first input nodes) and output node 41a4 (one of second output nodes). The output node 21a3 of the sub-preamplifier 21a is connected to the input node 41a3 of the sub-converter 41a. The sub-preamplifier 21a amplifies the positive-phase component of the differential input signal and outputs an amplified positive-phase component (positive-phase component of first differential signal) to the sub-converter 41a. The sub-converter 41b includes an input node 41b3 (another of the first input nodes) and output node 41b4 (another of the second output nodes). The output node 21b3 of the sub-preamplifier 21b is connected to the input node 41b3 of the sub-converter 41b. The sub-preamplifier 21b amplifies the negative-phase component of the differential input signal and outputs an amplified negative-phase signal (negative-phase component of the first differential signal) to the sub-converter 41b.

The sub-preamplifier 21a has a delay time defined as a time from the instant that the positive-phase component of the differential input signal is input to the input terminal Dina to the instant that the amplified positive-phase component is output to the sub-converter 41a. Likewise, the sub-preamplifier 21b has a delay time defined as a time from the instant that the negative-phase component of the differential input signal is input to the input terminal Dinb to the instant that the amplified negative-phase component is output to the sub-converter 41b. By using the same circuit structure or the same circuit arrangement both for the sub-amplifiers 21a, 21b, the delay time of the sub-preamplifier 21a can be set to be substantially equal to the delay time of the sub-amplifier 21b. Furthermore, the sub-preamplifiers 21a, 21b can be set to have the same voltage gain. As the positive-phase component and the negative-phase component of the differential input signal generally have the same amplitude, the amplified positive-phase component (positive-phase component of the first differential signal) output from the sub-preamplifier 21a and the amplified negative-phase component (negative-phase component of the first differential signal) output from the sub-preamplifier 21b also have the same amplitude.

The impedance converter 4 receives a differential signal (first differential signal) from the pre-amplifier 2 with some input impedance (first input impedance). As aforementioned, the pre-amplifier 2 outputs the amplified differential input signal (second differential signal) to the TWA 3 with some output impedance (first output impedance). The input impedance (first input impedance) of the impedance converter 4 is set be sufficiently greater than the output impedance (first output impedance) of the pre-amplifier 2.

The impedance converter 4 generates a converted differential signal (second differential signal) in accordance with the amplified differential input signal (first differential signal) and outputs the converted differential signal to the TWA 3 with output impedance (second output impedance), which is set to be smaller than the input impedance of the impedance converter 4 (first input impedance). Accordingly, the impedance converter 4 may provide the converted differential signal to the TWA 3 with the output impedance (second output impedance) different from the output impedance of the pre-amplifier 2 (first output impedance).

Specifically, the impedance converter 4 further includes a pair of input nodes 41a3, 41b3 (first input nodes), and a pair of output nodes 41a4, 41b4 (second output nodes). The input node 41a3 (one of the first input nodes) corresponds to an input node of the sub-converter 41a. The input node 41a3 of the sub-converter 41a is connected to the output node 21a3 (one of the first output nodes) of the sub-amplifier 21a. The input node 41a3 receives a positive-phase component of the amplified differential input signal (first differential signal) from the output node 21a3 of the sub-amplifier 21a. The sub-converter 41a outputs a positive-phase component of the amplified differential input signal (second differential signal) to the TWA 3 with the output impedance (second output impedance) of the sub-converter 41a instead of the output impedance of the sub-amplifier 21a. The input node 41b3 (another of the first input nodes) corresponds to an input node of the sub-converter 41b. The input node 41b3 of the sub-converter 41b is connected to the output node 21b3 (another of the first output nodes) of the sub-amplifier 21b. The input node 41b3 receives a negative-phase component of the amplified differential input signal (first differential signal) from the output node 21b3 of the sub-amplifier 21b. The sub-converter 41b outputs a negative-phase component of the amplified differential input signal (second differential signal) to the TWA 3 with the output impedance (second output impedance) of the sub-converter instead of the output impedance of the sub-amplifier.

For the impedance converter 4, the input impedance (first input impedance) viewed from the input node 41a3 is greater than the output impedance (second output impedance) viewed from the output node 41a4. The input impedance (first input impedance) viewed from the input node 41b3 is greater than the output impedance (second output impedance) viewed from the output node 41b4. Therefore, the input impedance of the sub-converter 41a (first input impedance) is greater than the output impedance of the sub-converter 41a (second output impedance) and also greater than the output impedance of the sub-preamplifier 21a (first output impedance). The input impedance of the sub-converter 41b (first input impedance) is greater than the output impedance of the sub-converter 41b (second output impedance) and also greater than the output impedance of the sub-preamplifier 21b (first output impedance). By using the same circuit structure or the same circuit arrangement both for the sub-converter 41a, 41b, a delay time of the sub-converter 41a can be set to be substantially equal to a delay time of the sub-converter 41b. The delay time of the sub-converter 41a is defined as a time from the instant that the positive-phase component of the amplified differential input signal is input to the input node 41a3 to the instant that the converted positive-phase component is output from the output node 41a4. Also, the delay time of the sub-converter 41b is defined as a time from the instant that the negative-phase component of the amplified differential input signal is input to the input node 41b3 to the instant that the converted negative-phase component is output from the output node 41b4.

The TWA 3 amplifies the converted differential signal (second differential signal) output from the impedance converter 4 and output an amplified differential signal as the differential output signal. Namely, The TWA 3 receives the amplified differential input signal output from the pre-amplifier 2 through the impedance converter 4 and generates the differential output signal in accordance with the amplified differential input signal (second differential signal). The TWA 3 also maintains the difference in phase between the positive-phase component and the negative-phase component of the amplified differential input signal during the amplification thereof. Hereafter, the wording "difference in phase" may be referred to as "phase difference". The TWA 3 is sometimes referred as the distributed constant amplifier. The TWA 3 includes a positive-phase part 3a and a negative-phase part 3b. The positive-phase part 3a includes an input node 3a1 (one of the second input nodes), an input-side transmission line 31a (one of input lines), and an output transmission line 32a (one of output lines). The input node 3a1 receives a positive-phase component of the converted differential signal output from the output node 41a4 of the impedance converter 4. The positive-phase input line 31a (one of the input lines) has an input end (first end) thereof, which is connected to the input node 3a1 (one of the second input nodes). The negative-phase part 3b includes an input node 3b1 (another of the second input nodes), an input-side transmission line 31b (another of the input lines), and an output-side transmission line 32b (another of the output lines). The input node 3b1 (another of the second input nodes) receives a negative-phase component of the converted differential signal output from the output node 41b4 of the impedance converter 4. The negative-phase input line 31b has an input end (first end) thereof, which is connected to the input node 3b1 (another of the second input nodes)

The TWA 3 further includes a plurality of sub-amplifiers (cells), Cell_1 to Cell_N, where N is an integer equal to or greater than 2. The sub-amplifiers Cell_1 to Cell_N are differential amplifiers having the same circuit structure to each other. Each of the sub-amplifiers Cell_1 to Cell_N receives the positive-phase component and the negative phase component of the converted differential signal and amplifies the positive-phase and negative-phase components to output the differential output signal. The sub-amplifiers Cell_1 to Cell_N are included in both of the positive-phase part 3a and the negative-phase part 3b to amplify the converted differential signal constituted of the positive-phase phase component and the negative-phase component thereof.

The positive-phase input line 31a (one of the input lines) includes a plurality of units Lina_0 to Lina_N, a resistive element 31a1 (termination resistor), and a capacitor 31a2. The end (first end) of the positive-phase input line 31a receives the positive-phase component of the converted differential signal output from the sub-converter 41a. The negative-phase input line 31b (another of the input lines) includes a plurality of units Linb_0 to Linb_N, a resistive element 31b1 (termination resistor), and a capacitor 31b2. The end (first end) of the negative-phase input line 31b receives the negative-phase component of the converted differential signal output from the sub-converter 41a.

The positive-phase output line 32a (one of the output lines) includes a resistive element 32a1 (termination resistor) and a plurality of units Louta_0 to Louta_N. The positive-phase output line 32a transmits respective positive-phase components output from the units Cell_1 to Cell_N to an output end (second end) thereof, which is connected to the output terminal Douta as described later. The positive-phase components are superimposed together during transmissions thereof and output as a positive-phase component of the differential output signal for driving the external apparatus like TOSA and optical modulator. The negative-phase output line 32b (another of the output lines) includes a resistive element 32b1 (termination resistor) and a plurality of units Loutb_0 to Loutb_N. The negative-phase output line 32b transmits respective negative-phase components output from the units Cell_1 to Cell_N to an output end (second end) thereof, which is connected to the output terminal Doutb as described later. The negative-phase components are superimposed together during transmissions thereof and output as a negative-phase component of the differential output signal for driving the external apparatus (second apparatus) like TOSA and optical modulator. However, the negative-phase component of the differential output signal may be connected to an external termination resistor instead of the external apparatus (second apparatus), in a case that external apparatus (second apparatus) needs only the positive-phase component of the differential output signal. The external termination resistor consumes electrical power of the negative-phase component of the differential output signal for impedance matching.

The units of the positive-phase input line Lina_0 to Lina_N are connected in cascade in this order for transmitting the positive-phase component of the converted differential signal (second differential signal) to the sub-amplifiers Cell_1 to Cell_N. The units of the negative-phase input line Linb_0 to Linb_N are connected in cascade in this order for transmitting the negative-phase components of the converted differential signal (second differential signal) to the sub-amplifiers Cell_to Cell_N.

The resistive element 32a1, the units of the positive-phase output line Louta_0 to Louta_N are connected in cascade in this order for transmitting the positive-phase components output from the sub-amplifiers Cell_1 to Cell_N. The resistive element 32b1, the units of the negative-phase output line Loutb_0 to Loutb_N are connected in cascade in this order for transmitting the negative-phase components output from the sub-amplifiers Cell_1 to Cell_N.

The unit of the positive-phase input line Lina_0 has an end (first end), which is connected to the output node 41a4 (one of the second output nodes) of the sub-converter 41a. An end of the capacitor 31a2 is connected to the resistive element 31a1 and the other end of the capacitor 32a2 is grounded. An end of the capacitor 31b2 is connected to the resistive element 31b1 and the other end of the capacitor 32b2 is grounded. An end of the resistive element 32a1 is connected to a power supply Via. The power supply Via supplies a supply voltage, for example, from 4 V to 8 V, to the positive-phase part 3a and the sub-amplifiers Cell_to Cell_N. The supply voltage of the power supply V1a may be set to be equal to the supply voltage of the power supply Vcc. The other end of the resistive element 32a1 is connected to the first unit of the positive-phase output line Louta_0. An end of the resistive element 32b1 is connected to a power supply V1b. The power supply V1b supplies a supply voltage, for example, from 4 V to 8 V, to the positive-phase part 3a and the sub-amplifiers Cell_1 to Cell_N. The supply voltage of the power supply V1b may be set to be equal to the supply voltage of the power supply Vcc. The other end of the resistive element 32b1 is connected to the first unit of the positive-phase output line Loutb_0. An end of the Nth unit of the positive-phase output line Louta_N is connected to the (N−1)th unit of the positive-phase output line Louta_(N−1) and the other end of the Nth unit of the positive-phase output line Louta_N is connected to the output terminal Douta. An end of the Nth unit of the negative-phase output line Loutb_N is connected to the (N−1)th unit of the negative-phase output line Loutb_(N−1) and the other end of the Nth unit of the negative-phase output line Loutb_N is connected to the output terminal Doutb.

The characteristic impedance of the units Lina_0 to Lina_N of the positive-phase input line 31a is set to match with impedance (resistance) of the resistive element 31a1. Likewise, the characteristic impedance of the units Linb_0 to Linb_N of the negative-phase input line 31b is set to be match with impedance (resistance) of the resistive element 31b1. The characteristic impedance of the units Louta_0 to Louta_N of the positive-phase output line 32a is set to be match with impedance (resistance) of the resistive element 32a1. The characteristic impedance of the units Loutb_0 to Loutb_N of the negative-phase output line 32b is set to match with a same value of impedance (resistance) of the resistive element 32b1.

In general, a positive-phase component and a negative-phase component of a differential signal are complementary signals, which have opposite phases to each other. Therefore, the phase difference between the positive-phase and negative-phase signals can be maintained by setting a delay time of the positive-phase input line to be equal to a delay time of the negative-phase input line. For this purpose, at least, a resistance value of the resistive element 31a1 is set to be equal to a resistance value of the resistive element 31b1, for example, 50Ω. Likewise, regarding the positive-phase output line and the negative-phase output line, at least a resistance value of the resistive element 32a1 is set to be equal to a resistance value of the resistive element 32b1, for example, 50Ω.

Output impedance of the positive-phase output line 32a, which corresponds to output impedance of the amplifier 1, should be matched with input impedance of the external apparatus (second apparatus), or alternatively characteristic impedance of a transmission line arranged for transmitting a positive-phase component of the differential output signal to the external apparatus (second apparatus). Output impedance of the negative-phase output line 32b, which corresponds to output impedance of the amplifier 1, should be matched with input impedance of the external apparatus (second apparatus), or alternatively characteristic impedance of a transmission line arranged for transmitting a negative-phase component of the differential output signal to the external apparatus (second apparatus).

Each of the sub-amplifiers Cell_1 to Cell_N includes a positive-phase input node (non-inverted input node), a negative-phase input node (inverted input node), a positive-phase output node (non-inverted output node), and a negative-phase output node (inverted output node). Each of the positive-phase input nodes of the sub-amplifiers Cell_1 to Cell_N is connected to the positive-phase input line 31a. Each of the negative-phase input nodes of the sub-amplifiers Cell_1 to Cell_N is connected to the negative-phase input line 31b. Each of the positive-phase output nodes of the sub-amplifiers Cell_1 to Cell_N is connected to the positive-phase output line 32a. Each of the negative-phase output nodes of the sub-amplifiers Cell_1 to Cell_N is connected to the negative-phase output line 32b.

More specifically, the positive-phase input node of the sub-amplifier Cell_1 is connected to a point between the unit Lina_0 and the unit Lina_1 of the positive-phase input line 31a. The negative-phase input node of the sub-amplifier Cell_1 is connected to a point between the unit Linb_0 and the unit Linb_1 of the negative-phase input line 31b. The positive-phase output node of the sub-amplifier Cell_1 is connected to a point between the unit Louta_0 and the unit Louta_1 of the positive-phase output line 32a. The negative-phase output node of the sub-amplifier Cell_1 is connected to a point between the unit Loutb_0 and the unit Loutb_1 of the negative-phase output line 32b.

The positive-phase input node of the sub-amplifier Cell_2 is connected to a point between the unit Lina_1 and the unit Lina_2 of the positive-phase input line 31a. The negative-phase input node of the sub-amplifier Cell_2 is connected to a point between the unit Linb_1 and the unit Linb_2 of the negative-phase input line 31b. The positive-phase output node of the sub-amplifier Cell_2 is connected to a point between the unit Louta_1 and the unit Louta_2 of the positive-phase output line 32a. The negative-phase output node of the sub-amplifier Cell_2 is connected to a point between the unit Loutb_1 and the unit Loutb_2 of the negative-phase output line 32b.

Likewise, the positive-phase input node of the sub-amplifier Cell_N is connected to a point between the unit Lina_(N−1) and the unit Lina_N of the positive-phase input line 31a. The negative-phase input node of the sub-amplifier Cell_N is connected to a point between the unit Linb_(N−1) and the unit Linb_N of the negative-phase input line 31b. The positive-phase output node of the sub-amplifier Cell_N is connected to a point between the unit Louta_(N−1) and the unit Louta_N of the positive-phase output line 32a. The negative-phase output node of the sub-amplifier Cell_N is connected to a point between the unit Loutb_(N−1) and the unit Loutb_N of the negative-phase output line 32b.

Regarding the units Cell_3 to Cell (N−1), each of the positive-phase input nodes thereof, each of the negative-phase input nodes thereof, each of the positive-phase output nodes thereof, and each of the negative-phase output nodes thereof are connected to the positive-phase input line 31a, the negative-phase input line 31b, the positive-phase output line 32a, and the negative-phase output line 32b, respectively.

Each of the units Lina_0 to Lina_N, each of the units Linb_0 to Linb_N, each of the units Louta_0 to Louta_N, and each of the units Loutb_0 to Loutb_N are distributed constant transmission lines. The distributed constant transmission line includes an inductive element (inductor), a capacitive element (capacitor), and a resistive element (resistor).

Each capacitive element of the units includes a static capacitor (input capacitor or output capacitor) of the sub-amplifier connected to the unit thereof. More specifically, a capacitive element of the unit Lina_i, where number i is an integer from 1 to N, includes an input capacitance of the positive-phase input node of the sub-amplifier Cell_i. A capacitive element of the unit Linb_i includes an input capacitance of the negative-phase input node of the sub-amplifier Cell_i. A capacitive element of the unit Louta_i includes an output capacitance of the positive-phase output node of the sub-amplifier Cell_i. A capacitive element of the unit Loutb_i includes an output capacitance of the negative-phase output node of the sub-amplifier Cell_i. Accordingly, any of these capacitive elements has capacitance, whose value is equal or greater than a value of an input capacitance or an output capacitance of the sub-amplifier connected therewith. In addition, the capacitive element may include capacitance of a parasitic capacitor of the relevant transmission line, which should be considered for accurate analysis. In the description of the amplifier 1, every single of resistive elements is assumed to be null.

Each characteristic impedance of the units Lina_i, Linb_i, Louta_i, and Loutb_i is approximately calculated by a formula $Z=\sqrt{(L/C)}$, where Z is characteristic impedance, L is inductance of an inductive element, and C is capacitance of a capacitive element. In general, L and C may be varied by difference between actual physical structures of the transmission lines. In the following description, a physical structure is assumed to be the same for all of the units Lina_i, Linb_i, Louta_i, and Loutb_i. Accordingly, they have the same characteristic impedance. On the same assumption, a cut-off frequency, which is calculated by a formula $fc=1/\sqrt{(L \times C)}$, where fc is cut-off frequency, becomes identical for all of the units Lina_i, Linb_i, Louta_i, and Loutb_i. Also, phase velocity v defined as $v=\sqrt{(L \times C)}$ becomes identical for all of the units Lina_i, Linb_i, Louta_i, and Loutb_i.

Referring back to FIG. 1, the positive-phase component of the differential input signal amplified by the sub-preamplifier 21a is input to the positive-phase input nodes of the sub-amplifiers Cell_1 to Cell_N of the TWA 3 through the sub-converter 41a and the positive-phase input line 31a. The positive-phase components output from the respective positive-phase output nodes of the sub-amplifiers Cell_1 to Cell_N are transmitted through the positive-phase output line 32a to the positive-phase output terminal Douta and superimposed with each other during the transmission to output the positive-phase component of the differential output signal to the external apparatus (second apparatus). The negative-phase component of the differential input signal amplified by the sub-preamplifier 21b is input to the negative-phase input nodes of the sub-amplifiers Cell_1 to Cell_N of the TWA 3 through the sub-converter 41b and the negative-phase input line 31b. The negative-phase components output from the respective negative-phase output nodes of the sub-amplifiers Cell_1I to Cell_N are transmitted through the negative-phase output line 32b to the negative-phase output terminal Doutb and superimposed with each other during the transmission to output the negative phase of the differential output signal to the external apparatus (second apparatus).

For the positive-phase component output from the unit Lina_(i−1) of the positive-phase input line 31a, the time to go through the unit Lina_i and the sub-amplifier Cell_(i+1) is set to be equal to the time to go through the sub-amplifier Cell_i and the unit Louta_i of the positive-phase output line 32a. This is enabled, for example, by equalizing the delay time of the unit Lina_i to the delay time of the unit Louta_i and also using the same circuit structure for the sub-amplifiers Cell_i, Cell_(i+1). As aforementioned, adjusting a phase velocity of the unit Lina_i to a phase velocity of the unit Louta_i brings the same delay time to the unit Lina_i and the unit Louta_i. Here, it is assumed that sub-amplifiers having the same circuit structure provide the same delay times from an input node thereof to an output node thereof.

For the negative-phase component output from the unit Linb_(i−1) of the negative-phase input line 31b, the time to go through the unit Linb_i and the sub-amplifier Cell_(i+1) is set to be equal to the time to go through the sub-amplifier Cell_i and the unit Loutb_i of the negative-phase output line 32b. This is enabled, for example, by equalizing the delay time of the unit Linb_i to the delay time of the unit Loutb_i and also using the same circuit structure for the sub-amplifiers Cell_i, Cell_(i+1). As aforementioned, adjusting a phase velocity of the unit Linb_i to a phase velocity of the unit Loutb_i brings the same delay time to the unit Linb_i and the unit Loutb_i. Here, it is assumed that sub-amplifiers having the same circuit structure provide the same delay times from an input node thereof to an output node thereof.

The above setting is possible for i=1 to (N−1). Furthermore, the delay time of the unit Lina_N of the positive-phase input line 31a is set to be equal to the delay time of the unit Louta_N of the positive-phase output line 32a. Likewise, the delay time of the unit Linb_N of the negative-phase input line 31b is set to be equal to the delay time of the unit Loutb_N of the negative-phase output line 32b. Thus, a difference in phase between the positive-phase component output from the output terminal Douta and the negative-phase component output from the output terminal Doutb after the differential input signal is amplified by the amplifier 1 is kept from deviating from the difference in phase between the positive-phase component, which is input to the input terminal Dina, and the negative-phase component input to the input terminal Dinb, of the differential input signal (the difference in phase between the positive-phase and negative-phase components of the differential input signal is maintained until the amplifier 1 amplifies the differential input signal and output an amplified differential signal as the differential output signal).

Accordingly, the amplifier 1 amplifies the differential input signal and output the amplified differential input signal as the differential output signal, with maintaining the difference in phase between the positive-phase component of the differential input signal input to the input terminal Dina and the negative-phase component of the differential input signal input to the input terminal Dinb. The differential output signal has a difference in phase between the positive-phase component output from the output terminal Douta and the negative-phase component output from the output terminal Doutb. As described above, by setting each of the pre-amplifier 2, the impedance converter 4, and the TWA 3 to maintain the phase difference of the differential signal thereof constant, the amplifier 1 enables that the phase difference of the differential output signal is identical to the phase difference of the differential input signal.

The sub-preamplifier 21a, the sub-converter 41a, and the positive-phase part 3a of the TWA 3 constitute a positive-phase part of the amplifier 1. In the positive-phase part of the amplifier 1, varying in resistance of the resistive element 21a2 causes varying in voltage gain of the sub-preamplifier 21a. The sub-preamplifier 21b, the sub-converter 41b, and the negative-phase part 3b of the TWA 3 constitute a negative-phase part of the amplifier 1. In the negative-phase part of the amplifier 1, varying in resistance of the resistive element 21b2 causes varying in voltage gain of the sub-preamplifier 21b. Specifically, voltage gain of the amplifying circuit 21a1, which corresponds to voltage gain of the sub-preamplifier 21a, is proportional to resistance RL of the output resistor of the sub-preamplifier 21a (the resistive element 21a2). Therefore, increase in resistance RL causes increase in voltage gain of the sub-preamplifier 21a1. In a case that the input impedance of the sub-converter 41a is sufficiently greater than the resistance RL of the resistive element 21a2, the resistance RL can be selected independently of input impedance of the input node 3a1 of the TWA 3. The input impedance of the input node 3a1 of the TWA 3 corresponds to characteristic impedance of the positive-phase input line 31a. Likewise, in a case that the input impedance of the sub-converter 41b is sufficiently greater than the resistance RL of the resistive element 21b2, the resistance RL can be selected independently of input impedance of the input node 3b1 of the TWA 3. Therefore, the resistance RL of output resistors (the resistive elements 21a2, 21b2) of the pre-amplifier 2 is selectable independently of the input impedance of the TWA 3.

Here, an amplifier of a comparative example is described to show advantage of the amplifier 1 according to the embodiment of the present invention. FIG. 4 is a circuit diagram of an amplifier 10 of the comparative example. The amplifier 10 illustrated in FIG. 4 includes a pair of input terminals Dina, Dinb, a pre-amplifier 2, a TWA 30, and a pair of output terminals Douta, Doutb. In the comparison with the amplifier 1, the amplifier 10 does not have the impedance converter 4 between the pre-amplifier 2 and the TWA 30. The amplifier 10 includes a pair of input terminals Dina, Dinb, a pre-amplifier 2, a TWA, and a pair of output terminals Douta, Doutb. The pair of the input terminals Dina, Dinb receives a differential input signal from an external apparatus (first apparatus). The pre-amplifier 2 receives the differential input signal through the input terminals Dina, Dinb and amplifies the differential input signal. The pre-amplifier 2 outputs an amplified differential input signal to the TWA 30. The TWA 30 amplifies the amplified differential input signal and outputs an amplified differential signal to an external apparatus (second apparatus).

The circuit structure of the TWA 30 is the same as the circuit structure of the TWA 3. The TWA 30 includes a pair of input-side transmission lines (a positive-phase input line 33a and a negative-phase input line 33b), a plurality of sub-amplifiers Cell_1 to Cell_N, where N is an integer equal to or greater than 2, and a pair of output-side transmission lines (a positive-phase output line 32a and a negative-phase output line 32b). Each of the sub-amplifiers receives the amplified differential input signal from the pre-amplifier 2 through the pair of the input-side transmission lines and generates an amplified differential signal in accordance with the amplified differential input signal. The sub-amplifiers Cell_1 to Cell_N are substantially the same differential amplifiers to each other. The respective amplified differential signals output from the sub-amplifiers Cell_1 to Cell_N are transmitted to the pair of the output terminals Douta, Doutb through the pair of the output-side transmission lines. The respective amplified differential signals output from the sub-amplifiers Cell_1 to Cell_N are superimposed with each other during the transmission to be output as the differential output signal from the pair of the output-side terminals Douta, Doutb to the external apparatus (second apparatus).

The amplifier 10 maintains a phase difference between the positive-phase component and the negative-phase component of the differential input signal input to the pair of the input terminal Dina, Dinb. Accordingly, a phase difference between the positive-phase component and the negative-phase component of the differential output signal output from the pair of the output terminals Douta, Doutb is kept from deviating from the phase difference of the differential input signal.

The positive-phase input line 33a includes a plurality of units Lina_0 to Lina_N and a resistive element 33a1 (termination resistor). The negative-phase input line 33b includes a plurality of units Linb_0 to Linb_N and a resistive element 33b1 (termination resistor). The positive-phase output line 32a includes a plurality of units Louta_0 to Louta_N and a resistive element 32a1 (termination resistor). The negative-phase output line 32b includes a plurality of units Loutb_0 to Loutb_N and a resistive element 32b1 (termination resistor). Resistance of the resistive element 32a1, 32b1 is, for example, set 50Ω to match with characteristic impedance of the output transmission lines 32a, 32b. The resistive elements 32a1, 32b1 may be connected to a power supply Vcc, which have supply voltage, for example, from 4V to 8V.

Each of the units Lina_0 to Lina_N is a distributed constant line, which include an inductive element, a capacitive element, and a resistive element. Each of the capacitive elements of the units Lina_0 to Lina_N may include capacitance of a parasitic capacitor of the relevant transmission lines. Every single of the capacitive elements has capacitance, whose value is equal or greater than a value of an input capacitance or an output capacitance of the sub-amplifier connected therewith. In the description of the amplifier 10, every single of the resistive elements is assumed to be null.

The pre-amplifier 2 includes two sub-preamplifiers 21a, 21b. The sub-preamplifier 21a includes an amplifying circuit 21a1 and a resistive element 21a2. The amplifying circuit 21a1 has an input node and an output node. The input node of the amplifying circuit 21a1 corresponds to an input node of the sub-preamplifier 21a. The output node of the amplifying circuit 21a1 is connected to the power supply Vcc through the resistive element 21a2. The output node of the amplifying circuit 21a1 corresponds to an output node of the sub-preamplifier 21a. The output node of the sub-preamplifier 21a is directly connected to an input end of the positive-phase input line 33a.

In a case that the amplifying circuit 21a1 provides a driving current to the resistive element 21a2, voltage gain of the sub-preamplifier 21a primarily depends on resistance of the resistive element 21a2. Specifically, increase in resistance of the resistive element 21a2 causes increase in voltage gain of the sub-preamplifier 21a1. Here, the resistive element 21a2 of the sub-preamplifier 21a and the resistive element 33a1 of the positive-phase input line 33a are assumed to have the same resistance RL. Also, the resistive elements of the units Lina_0 to Lina_N of the positive-phase input line 33a are assumed to be null. On such condition, the loading circuit to be driven by the sub-preamplifier 21a has resistance of RL/2, because the loading circuit is a parallel circuit of two resistors each having resistance of RL. In a case that the driving current is saturated to a constant value, voltage gain of the sub-preamplifier 21a is proportional to resistance of the loading circuit, namely, RL/2. Increase in resistance of the resistive element 21a2 causes increase in voltage gain of the sub-preamplifier 21a.

However, in the aspect of impedance matching between output impedance of the sub-preamplifier 21a and input impedance of the TWA 30, increase in resistance of the resistive element 21a2 needs increase in input impedance of the TWA 30. The input impedance of the TWA 30 viewed from the sub-amplifier 21a corresponds to characteristic impedance Z of the positive-phase input line 33a, which is expressed by a formula $Z=\sqrt{(L/C)}$. By increasing inductance L and/or decreasing capacitance C in the respective sub-amplifiers Cell_1 to Cell_N, the characteristic impedance Z of the positive-phase input line 33a will increase. However, as each capacitance C of the units of Cell_1 to Cell_N has a lower limit as described above, each inductance L of the units of Cell_1 to Cell_N may be increased. In a case that each inductance L of the units of Cell_1 to Cell_N is increased, cut-off frequency $fc=1/\sqrt{(L \times C)}$ of the positive-phase input line will be decreased. Consequently, increase in voltage gain of the sub-preamplifier 21a causes decrease (deterioration) in cut-off frequency of the amplifier 10. Such trade off prevents the amplifier 10 from achieving high speed performance. The sub-preamplifier 21b and the negative-phase input line 33b of the TWA 30 have the same trade off.

Moving back to the amplifier 1, the amplifier 1 has an advantage for enabling a higher voltage gain of the preamplifier 2 and a wider frequency band (higher cut-off frequency) of the TWA 3. Specifically, the amplifier 1 according to an embodiment of the present invention has the impedance converter 4 between the pre-amplifier 2 and the TWA 3. The sub-converter 41a has input impedance sufficiently greater than the resistance of the resistive element 21a2. The resistance RL of the resistive element 21a2 may be selected in a wide range independently of the characteristic impedance of the positive-phase input line 31a, in a case of the output impedance of the sub-converter 41a (second output impedance) is substantially comparable with the characteristic impedance of the positive-phase input line 31a. The voltage gain of the sub-preamplifier 21a is not restricted by the impedance matching issue between the output impedance of the sub-amplifier 21a and the input impedance of the positive-phase input line 31a. Thus, in the amplifier 1, the voltage gain of the sub-preamplifier 21a may be increased without degrading the cut-off frequency the TWA 3. As a result, increase in voltage gain of the sub-amplifier 21a causes increase in voltage gain of the amplifier 1, because the sub-preamplifier 21a and the positive-phase part 3a of the TWA 3 are connected in cascade for amplification. Here, the amplifying circuit 21a1 is assumed to have output impedance sufficiently greater than the resistance of the resistive element 21a2. In a case that the amplifying circuit 21a2 provides a saturated driving current to the resistive element 21a2, such condition may be satisfied.

Likewise, the resistance RL of the resistive element 21b2 may be selected in a wide range independently of the characteristic impedance of the negative-phase input line 31b. The voltage gain of the sub-preamplifier 21b may be increased without degrading the cut-off frequency the TWA 3. The sub-converter 41b has input impedance sufficiently greater than the resistance RL of the resistive element 21b2. The amplifying circuit 21b1 is assumed to have output impedance sufficiently greater than the resistance of the resistive element 21b2.

Furthermore, the amplifier 1 may maintain the input impedance of the TWA 3 in a case of increasing the resistance RL of the resistive element 21a2. Thus, each of the inductance L and the capacitance C of the units Lina_0 to Lina_N of the positive-phase input line 31a does not have to be changed. Accordingly, matching of phase velocity v between the input transmission line 31a and the output-side transmission line 32a may not be affected by the resistance RL of the resistive element 21a2. As aforementioned, by setting each phase velocity of the input transmission lines 31a, 31b, and the output-side transmission lines 32a, 32b identical to each other, the time of the positive-phase component to go through the unit Lina_i and the time of the positive-phase component to go through the unit Louta_i may be equalized.

Figure 2A:
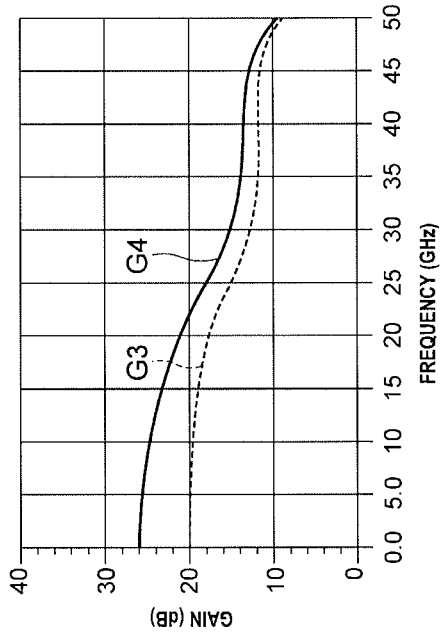
FIG. 2A is a graph indicating frequency characteristics of voltage gain of an amplifier for a comparative example.
Figure 2B:
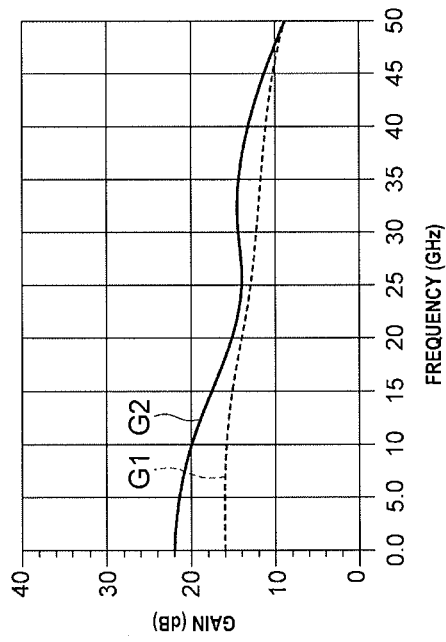
FIG. 2B is a graph indicating frequency characteristics of voltage gain of an amplifier according to an embodiment of the present invention.

Next, with referring to FIG. 2, an example of an advantage of the amplifier 1 according to the embodiment of the present invention is described. FIG. 2A is a graph indicating frequency characteristics of voltage gain of the amplifier 10 of a comparative example illustrated in FIG. 4. FIG. 2B is a graph indicating frequency characteristics of voltage gain of the amplifier 1 according to the embodiment of the present invention. The horizontal axis of FIG. 2A and FIG. 2B indicates frequency of the differential input signal input to the amplifier 10 or the amplifier 1. The vertical axis of FIG. 2A and FIG. 2B indicates voltage gain, whose unit is decibel (dB), of the amplifier 10 or the amplifier 1. The graphs in FIG. 2A and FIG. 2B indicate simulation results in a case of setting the number of the sub-amplifiers N to 5 both for the amplifier 10 and the amplifier 1. The curve G1 in FIG. 2A represents a result in a case that the characteristic impedance Z of the positive-phase input line 33a is set to 50Ω and the resistance RL of the resistive element 21a2 and the resistance of the resistive element 33a1 (termination resistor) are set to 50Ω. The amplifier 10 is assumed to have a symmetrical circuit structure for the positive-phase component and the negative-phase component of the differential input signal. For example, if the input terminal Dina is exchanged with the input terminal Dinb and also the output terminal Douta is exchanged with the output terminal Doutb, the transfer characteristic of the amplifier 1 shows no change between before and after the exchange. Accordingly, the resistance of the resistive element 21b2 is set to be equal to the resistance RL, specifically 50Ω, of the resistive element 21a2. Also, the resistance of the resistive element 33b1 is set to be equal to the resistance RL, specifically 50Ω, of the resistive element 33a1. In the following, only the positive-phase part of the amplifier 10 or the amplifier 1 is described and description about the negative-phase part is omitted. Unless otherwise specified, a negative-phase part of a differential circuit like the amplifier 10 and amplifier 1 has characteristics and performance identical to characteristics and performance of a positive-phase part of the differential amplifier.

The curve G2 in FIG. 2A represents a result in a case that the characteristic impedance Z of the positive-phase input line 33a is set to 50Ω and the resistance RL of the resistive element 21a2 and the resistance of the resistive element 33a1 (termination resistor) are set to 100Ω. The curve G3 represents a result in a case that the characteristic impedance Z of the positive-phase input line 31a is set to 50Ω and the resistance RL of the resistive element 21a2 and the resistance of the resistive element 31a1 (termination resistor) are set to 50Ω. The curve G4 represents a result in a case that the characteristic impedance Z of the positive-phase input line 31a is set to 50Ω and the resistance RL of the resistive element 21a2 is set to 100Ω, and the resistance of the resistive element 31a1 (termination resistor) is set to 50Ω. For the curves G1 to G4, the characteristic impedance Z of the positive-phase input line has no change and the resistance RL of the resistive element 21a2 has a change from 50Ω to 100Ω.

In a comparison of the curve G2 with the curve G1, the voltage gain of the curve G2 is expected to be twice of the voltage gain of the curve G1, because as mentioned above, the voltage gain of the sub-preamplifier 21a is proportional to the resistance RL of the resistive element 21a2, which is doubled from 50Ω to 100Ω. Actually, at 0 Hz (namely, in a DC operation), the curve G2 indicates 22 dB and the curve G1 indicates 16 dB. The difference 6 dB between 22 dB and 16 dB corresponds to twice in a linear scale. Both of the curves G1, G2, however, decrease with increase of the frequency, from the peak values thereof at 0 Hz. The degradation (from the peak value) of the curve G2 is greater than the degradation of the curve G1. For example, the voltage gains of the curve G1 and the curve G2 becomes comparable to each other around 15 dB to 16 dB at 20 GHz, so that the difference therebetween is degraded from 6 dB at 0 Hz. The root cause of the worse degradation of the curve G2 than the curve G1 is so-called impedance mismatching between the resistance RL=100Ω of the resistive element 21a and the characteristic impedance Z=50Ω of the positive-phase input line 33a. Such impedance mismatching is known to cause worse influence to voltage gain at a higher frequency. Accordingly, increase of the resistance RL does not contribute to improvement of the voltage gain at a high frequency, for example, higher than 20 GHz.

On the other hand, the curve G3 shows a better frequency characteristic than the curve G1, because in the amplifier 1, the voltage gain of the sub-preamplifier 21a is proportional to the resistance RL of the resistive element 21a2. Specifically, the impedance converter 4 (the sub-converter 41a) separates the resistive element 31a1 of the positive-phase input line 31a from the amplifying circuit 21a1. In the amplifier 1, the amplifying circuit 21a1 drives only the resistance RL=50Ω of the resistive element 21a2. Contrarily, in the amplifier 10, the amplifying circuit 21a1 have to drive not only the resistance RL=50Ω of the resistive element 21a2 but also the characteristic impedance Z=50Ω of the positive-phase input line 31a. Also, at a low frequency, the amplifying circuit 21a1 have to drive both of the resistance RL=50Ω of the resistive element 21a2 and the resistance 50Ω of the resistive element 33a1 (termination resistor) in parallel. Namely, the amplifying circuit 21a1 drives the resistance of 25Ω, in the amplifier 10. Accordingly, in a comparison of the curve G3 with the curve G1, the voltage gain of the curve G3 is expected to be twice of the voltage gain of the curve G1. Actually, at 0 Hz (namely, in a DC operation), the curve G3 indicates 20 dB and the curve G1 indicates 16 dB. The difference 4 dB in voltage gain between 20 dB and 16 dB corresponds to a multiplying factor of 1.6 in a linear scale. The reason why the difference in voltage gain between the curve G1 and the curve G3 does not become 6 dB (twice) at 0 Hz is that the sub-converter 41a has voltage gain smaller than 1, namely gives some loss to a signal. The loss is estimated as −2 dB, which corresponds to an attenuation factor of 0.4 in a linear scale.

In addition, in the comparison with the curve G3, the curve G4 shows better frequency characteristic than the curve G3, because the resistance RL of the resistive element 21a1 doubled from 50Ω to 100Ω further enhances the voltage gain of the sub-preamplifier 21a. Actually, at 0 Hz (namely, in a DC operation), the curve G4 indicates 26 dB and the curve G3 indicates 20 dB. The difference 6 dB in voltage gain between 26 dB and 20 dB corresponds to twice in a linear scale, as mentioned above. Furthermore, the amplifier 1 prevents the voltage gain from being degraded at a higher frequency. In FIG. 2B, even at 20 GHz, the curve G4 still keeps the difference (in voltage gain) with the curve G3 greater than 3 dB. The output impedance of the sub-converter 41a, which is set to be smaller than the resistance RL=100Ω of the resistive element 21a2, improves the impedance mismatching of the amplifier 10 described above. In addition, regarding the sub-converters 41a, 41b, the input impedance (first input impedance) thereof was assumed to be at least several kilo-ohms as described later, namely some value sufficiently greater than the output impedance of the sub-preamplifiers 21a, 21b, which may be about 50 to 100Ω as described above.

Figure 3:
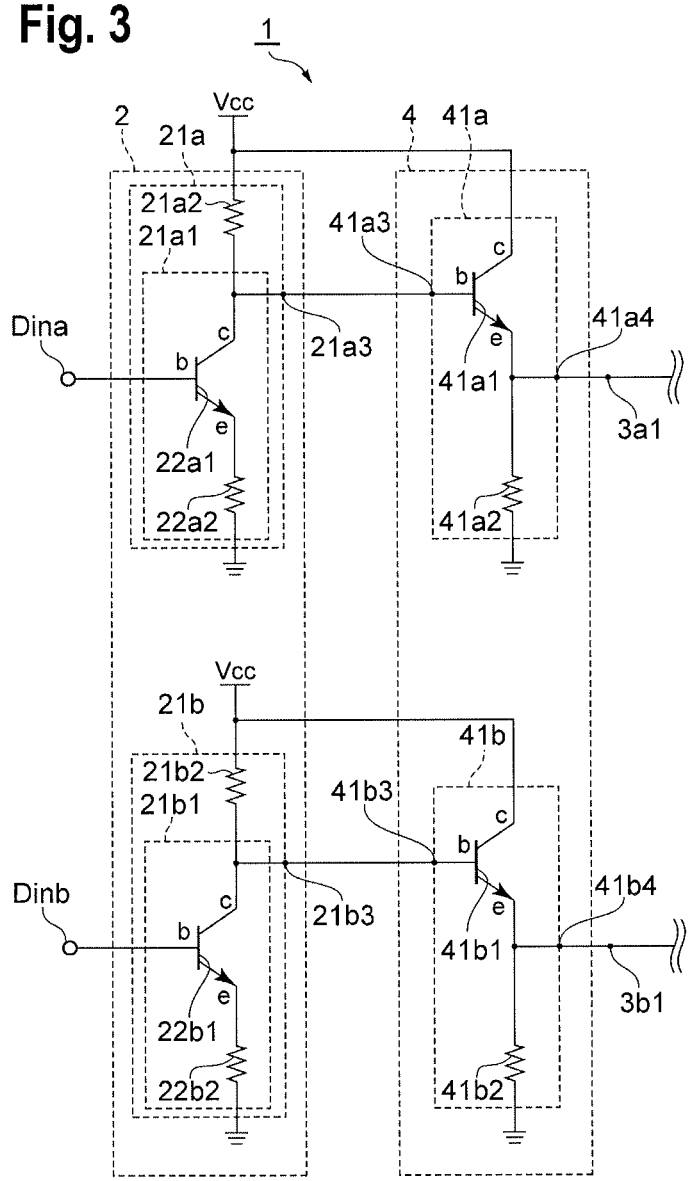
FIG. 3 is an exemplary circuit diagram of an amplifier according to an embodiment of the present invention.

Next, with referring to FIG. 3, an exemplary circuit structure of the sub-preamplifier 21a and the sub-converter 41a of the amplifier 1 is described. The amplifier 1 according to the embodiment of the present invention has an advantage described above with referring FIG. 2B. In the following, unless otherwise specified, the sub-preamplifier 21b has a circuit structure same to a circuit structure of the sub-preamplifier 21a and also the sub-converter 41b has a circuit structure same to a circuit structure of the sub-converter 41a. Description about the sub-preamplifier 21b and the sub-converter 41b may be omitted to avoid verboseness.

FIG. 3 is an exemplary circuit diagram of the pre-amplifier 2 and the impedance converter 4 of the amplifier 1 according to an embodiment of the present invention. The pre-amplifier 2 includes two sub-preamplifiers 21a, 21b and the impedance converter 4 include two sub-converters 41a, 41b. In FIG. 3, a circuit diagram of the TWA 3 is omitted except the input nodes 3a1, 3b1 thereof. The sub-preamplifier 21a includes an amplifying circuit 21a1, a resistive element 21a2, and an output node 21a3. The sub-preamplifier 21b includes an amplifying circuit 21b1, a resistive element 21b2, and an output node 21b3. The amplifying circuit 21a1 includes a transistor 22a1 and a resistive element 22a2. The amplifying circuit 21b1 includes a transistor 22b1 and a resistive element 22b2. The sub-converter 41a includes an input node 41a3, a transistor 41a1, a resistive element 41a2, and an output node 41a4. The sub-converter 41b includes an input node 41b3, a transistor 41b1, a resistive element 41b2, and an output node 41b4. The transistors 22a1, 22b1 have the same electrical characteristics to each other. The resistive elements 22a2, 22b2 have the same resistance to each other. The transistors 41a1, 41b1 have the same electrical characteristics to each other. The resistive elements 41a2, 41b2 have the same resistance to each other. The electrical characteristics of the transistors 41a1, 41b1 may be different from the electrical characteristics of the 22a1, 22b1. The resistance of 41a2, 41b2 may be different from the resistance of the resistive elements 22a2, 22b2.

The transistor 22a1 in FIG. 3 may be an NPN bipolar transistor. The base b (control terminal) of transistor 22a1 is connected to the input terminal Dina. A termination resistor (not shown) may be connected the input terminal Dina, for improving impedance matching with output impedance of an external apparatus (first apparatus), which provides a differential input signal to the input terminals Dina, Dinb, or characteristic impedance of a transmission line to connect the external apparatus with the input terminal Dina. The collector c (first current terminal) of the transistor 22a1 is connected to an end (first end) of the resistive element 21a2. The other end (second end) of the resistive element 21a2 is connected a power supply Vcc. The collector c of the transistor 22a1, which acts as an output node of the sub-preamplifier 21a, is connected to base b (control terminal) of the transistor 41a1 through the input node 41a3. The emitter e (second current terminal) of the transistor 22a1 is grounded through the resistive element 22a2.

The sub-converter 41a in FIG. 3 is an emitter-follower circuit. The base b (control terminal) of the transistor 41a1 is connected to the input node 41a3. The base b of the transistor 41a1 is connected to the output node 21a3, which is connected to the collector c of the transistor 22a1, of the sub-preamplifier 21a through the input node 41a3. The emitter e (second current terminal) of the transistor 41a1 is connected to the output node 41a4. The emitter e of the transistor 41a1l is grounded with the resistive element 41a2. The emitter e of the transistor 41a1 corresponds to the output node 41a4 of the sub-converter 41a. The emitter e of the transistor 41a1 is connected to the input node 3a1 of the positive-phase part of the TWA 3 through the output node 41a4. In the TWA 3 (not shown in FIG. 3), the input node 3a1 is connected to an end (input end) of a positive-phase input line 31a. The collector c of the transistor 41a1 is connected to the power supply Vcc.

The output impedance of the output node 41a4 of the sub-converter 41a is equal to the output impedance of the emitter-follower circuit. The output impedance of the emitter-follower circuit depends on electrical characteristics of the transistor 41a1. The voltage gain of the emitter-follower circuit is equal to or smaller than 1, and is hardly affected by decrease in output impedance of the emitter follower. In a case that some parasitic capacitor degrades the characteristic impedance of the positive-phase input line 31a, the output impedance of the sub-converter 41a may be adjusted to be smaller than the characteristic impedance of the positive input line 31a to offset the degradation. Such offset method may prevent the frequency characteristics of the TWA 3 from deteriorating. Therefore, the output impedance of the output node 41a4 of the sub-converter 41a may be smaller than the characteristic impedance of the positive-phase input line 31a. Likewise, the output impedance of the output node 41b4 of the sub-converter 41b may be smaller than the characteristic impedance of the negative-phase input line 31b.

The transistor 41a1 may be a n-MOSFET (Metal-Oxide-Semiconductor Field-Effect Transistor) instead of the NPN bipolar transistor. In addition, the sub-converter 41a may be a Darlington circuit constituted of a plurality of such transistors. The sub-preamplifier 21a may include more complicated amplifiers like cascaded amplifiers, a Cherry-Hooper amplifier, and so on. Then, regarding the sub-converters 41a (and also 41b), the input impedance (first input impedance) thereof is estimated to be several kilo-ohms or more for any circuit structure described above. Namely, the input impedance of the sub-converters 41a, 41b (first input impedance) is sufficiently greater than the output impedance of the sub-preamplifiers 21a, 21 b, even in a case that the input impedance of the sub-converters 41a, 41b are increased from 50 to 100Ω but stays still in several hundred-ohms. At the point of view of the fine impedance matching between the impedance converter 4 and the TWA 3, the output impedance of the sub-converters 41a, 41b (second output impedance) may be greater than a half and also smaller than one and a half times of the characteristic impedance of the positive-phase input line 31a and the negative-phase input line 31b. Namely, for example, the output impedance (second output impedance) in the range from 25Ω to 75Ω mat be realistic against the characteristic impedance 50Ω of the positive-phase input line 31a and negative-phase input line 31b, for achieving the fine impedance matching.

In a case that the pre-amplifier 2 and the impedance converter 4 shown in FIG. 3 are adapted to the amplifier 1 shown in FIG. 1, the voltage applied to the capacitor 31a2 of the positive-phase input line 31a is expressed by a formula V=Vcc−RL×I1, where Vcc is a supply voltage of the power supply Vcc, RL is resistance of the resistive element 21a2, and I1 is current flowing in the resistive element 21a2 (the positive-phase input line 31a is assumed to have no resistive element as mentioned above).

In both of the amplifier 10 and the amplifier 1, change in resistance of output resistor (the resistive element 21a1) of the sub-amplifier 21a causes change in voltage gain of the sub-amplifier 21a. In addition, increase in resistance Re of the resistive element 22a2 causes decrease in voltage gain of the sub-amplifier 21a and decrease in resistance Re of the resistive element 22a2 causes increase in voltage gain of the sub-amplifier 21a.

In a case that the pre-amplifier 2 shown in FIG. 3 is adapted to the amplifier 10 shown in FIG. 4, the sub-amplifier 21a drives not only the resistive element 21a1 but also the resistive element 33a1 of the positive-phase input line 33a, because the amplifier 10 does not include the impedance converter 4. Accordingly, the sub-amplifier 21a drives a parallel circuit constituted by the resistive element 21a2 and the resistive element 33a1, whose resistance becomes RL/2, where the resistive elements 21a2, 33a1 are assumed to have the same resistance RL and the positive-phase input line 33a is assumed to have no resistive elements. Thus, the voltage gain of the sub-amplifier 21a is expressed as a formula Gain=(RL/2)/Re.

On the other hand, in a case of the amplifier 1 according to the embodiment of the present invention, which includes the impedance converter 4 between the pre-amplifier 2 and the TWA 3, the sub-preamplifier 21a drives only the resistive element 21a2 and the voltage gain thereof is expressed as a formula Gain=RL/Re.

Suppose that the resistance RL is increased to increase the voltage gain of the sub-amplifier 21a. In a case of the amplifier 10 of the comparative example, the characteristic impedance Z of the positive-phase input line 33a should be increased with increase in the resistance RL to maintain the impedance matching between the sub-preamplifier 21a and the positive-phase input line 33a1. If the characteristic impedance is not increased, the impedance mismatching causes the degradation of the voltage gain at a higher frequency like the curve G2 shown in FIG. 2A. To increase the characteristic impedance Z, which is expressed by a formula $Z=\sqrt{(L/C)}$ as described above, each inductive element having inductance L of the units Lina_0 to Lina_N is increased and/or each capacitive element having capacitance C is decreased. However, decrease in capacitance C is restricted by the minimum value thereof. Increase in inductance L may be an alternative way, but it degrades bandwidth of the positive-phase input line 33a, because increase in inductance L causes decrease in cut-off frequency $fc=1/\sqrt{(L \times C)}$. Such degradation of the frequency characteristics of the positive-phase input line is disadvantage for improving the high speed performance of the amplifier 10. In addition, change in capacitance C and inductance L causes change in phase velocity $v=\sqrt{(L \times C)}$, so that the phase velocity of the positive-phase input line 33a may deviate from the phase velocity of the positive-phase output line 32a. Such deviation may deteriorate bandwidth of the TWA 30.

On the other hand, in a case of the amplifier 1 according to the embodiment of the present invention, increase in resistance RL of the resistive element 21a2 does not need increase in input impedance of the TWA 3 because the impedance converter 4 separates the TWA 3 from the pre-amplifier 2. Accordingly, characteristic impedance, cut-off frequency and phase velocity of the positive-phase input line 31a are maintained, when the resistance RL is increased to increase the voltage gain of the pre-amplifier 2.

Suppose that the resistance Re the resistive element 22a2 is decreased as an alternative way to increase the voltage gain of the sub-preamplifier 21a, for both of the amplifiers 1, 10, the voltage applied to the base b of the transistor 22a1 must be smaller than the maximum voltage Vinlimit=Re×I1. To maintain the maximum voltage Vinlimit against increase in the resistance Re, the current I1 flowing in the resistive element 21a2 needs to be increased. Increase in the current I1, however, cause increase in power consumption of the sub-preamplifier 21a and may be disadvantage for power saving.

Contrarily, in the amplifier 1 according to the embodiment of the present invention, the impedance converter 4 arranged between the pre-amplifier 2 and the TWA 3 enables the resistance RL of the resistive element 21a2 to be increased for increasing the voltage gain of the sub-amplifier 21a, independently of the characteristic impedance Z of the positive-phase input line 31a, by separating the TWA 3 from the pre-amplifier 2. Accordingly, the amplifier 1 does not have to decrease the resistance Re of the resistive element 22a2 and also increase the current I1 for compensation, to increase the voltage gain of the sub-amplifier 21a.

The amplifier 1 may be used in a driving circuit for optical communication, specifically, a driving circuit including a pre-amplifier and a TWA, which the voltage gain needs to be enhanced without degrading frequency characteristics. In the above, the amplifier according to the embodiment of the present invention is described with illustrating the principle. Note that the amplifier according to the embodiment is not restricted to that in the aforementioned embodiment, and other various modifications are possible for a person skilled in art without deviating from the principle.

What is claimed is:

1. An amplifier that receives a differential input signal and generates a differential output signal in accordance with the differential input signal, the differential input signal and the differential output signal each having a positive-phase component and a negative-phase component, the positive-phase components having a phase opposite to a phase of the negative-phase components, the amplifier comprising:
a pre-amplifier configured to receive the differential input signal and generate a first differential signal by amplifying the differential input signal, the first differential signal having a positive-phase component and a negative-phase component, the pre-amplifier including a pair of first output nodes that output the positive-phase component and the negative-phase component of the first differential signal, respectively, the pre-amplifier having a first output impedance viewed from the first output nodes;
an impedance converter including a pair of input nodes and a pair of second output nodes, the pair of the input nodes being configured to receive the positive-phase component and the negative-phase component of the first differential signal, respectively, the impedance converter having an input impedance viewed from the input nodes, the input impedance being greater than the first output impedance of the pre-amplifier, the impedance converter being configured to convert the first differential signal into a second differential signal having a positive-phase component and a negative-phase component, the pair of second output nodes being configured to output the positive-phase component and the negative-phase component of the second differential signal, respectively, the impedance converter having a second output impedance viewed from the second output nodes, the second output impedance being smaller than the first output impedance of the pre-amplifier; and
a traveling wave amplifier (TWA) configured to receive the second differential signal and generate the differential output signal in accordance with the second differential signal.

2. The amplifier according to claim 1,
wherein the pre-amplifier includes a pair of sub-preamplifiers, one of the sub-preamplifiers being configured to generate the positive-phase component of the first differential signal in accordance with the positive-phase component of the differential input signal, the other of the sub-preamplifiers being configured to generate the negative-phase component of the first differential signal in accordance with the negative-phase component of the differential input signal, said one of the sub-preamplifiers including a first resistive element connected to one of the first output nodes, and the other of the sub-preamplifiers including a second resistive element connected to the other of the first output nodes, the first resistive element and the second resistive element each having a first resistance that determines the first output impedance.

3. The amplifier according to claim 2,
wherein each of the sub-preamplifiers has a voltage gain proportional to the first resistance.

4. The amplifier according to claim 2,
wherein the pre-amplifiers each have a same circuit arrangement.

5. The amplifier according to claim 1,
wherein the impedance converter includes a pair of sub-converters,
wherein one of the sub-converters is configured to receive the positive-phase component of the first differential signal through one of the input nodes, convert the positive-phase component of the first differential signal into the positive-phase component of the second differential signal, and output the positive-phase component of the second differential signal from one of the second output nodes, wherein the other of the sub-converters is configured to receive the negative-phase component of the first differential signal through the other of the input nodes, convert the negative-phase component of the first differential signal into the negative-phase component of the second differential signal, and output the negative-phase component of the second differential signal from the other of the second output nodes.

6. The amplifier according to claim 5, wherein said one of the sub-converters includes a first transistor having a control terminal and two current terminals, the control terminal of the first transistor being connected to said one of the input nodes, one of the current terminals of the first transistor being connected to a power supply, the other of the current terminals of the first transistor being connected to said one of the second output nodes, wherein the other of the sub-converters includes a second transistor having a control terminal and two current terminals, the control terminal of the second transistor being connected to said other of the input nodes, one of the current terminals of the second transistor being connected to the power supply, the other of the current terminals of the second transistor being connected to said other of the second output nodes, and wherein the first transistor and the second transistor have same arrangements.

7. The amplifier according to claim 1, wherein the TWA includes a pair of input-side transmission lines each having a characteristic impedance, one of the input-side transmission lines being connected to one of the second output nodes of the impedance converter, the other of the input-side transmission lines being connected to the other of the second output nodes of the impedance converter, and wherein the second output impedance of the impedance converter is greater than a half of the characteristic impedance and smaller than one and a half times the characteristic impedance.

* * * * *